(12) United States Patent
Wang et al.

(10) Patent No.: US 9,372,234 B2
(45) Date of Patent: Jun. 21, 2016

(54) DETECTION METHOD OF CURRENT SENSOR FAULTS IN THE E-DRIVE SYSTEM BY USING THE VOLTAGE COMMAND ERROR

(71) Applicant: Ford Global Technologies, LLC, Dearborn, MI (US)

(72) Inventors: Chang-jiang Wang, Troy, MI (US); Michael Degner, Novi, MI (US); Rimma Isayeva, Farmington Hills, MI (US); Liwen Xu, Farmington Hills, MI (US); Daniel R. Luedtke, Beverly Hills, MI (US)

(73) Assignee: Ford Global Technologies, LLc, Dearborn, MI (US)

( * ) Notice: Subject to any disclaimer, the term of this patent is extended or adjusted under 35 U.S.C. 154(b) by 256 days.

(21) Appl. No.: 14/011,720

(22) Filed: Aug. 27, 2013

(65) Prior Publication Data
US 2015/0061708 A1 Mar. 5, 2015

(51) Int. Cl.
*G01R 31/319* (2006.01)
*H02P 29/02* (2016.01)

(52) U.S. Cl.
CPC .......... *G01R 31/3191* (2013.01); *H02P 29/024* (2013.01)

(58) Field of Classification Search
CPC .... G01R 31/343; G01R 31/025; G01R 25/00; G01R 27/32; G01R 31/02; G01R 31/3191; G01R 31/34; G01R 31/40; H02J 3/06; H02J 3/381; H02J 3/382; H02J 3/46; H02P 29/021; H02P 21/0003; H02P 21/0035; H02P 21/14; H02P 2203/11; H02P 25/021; H02P 25/023; H02P 25/14; H02P 29/0033; H02P 29/0038; H02P 6/16; H02P 6/18; H02P 29/024; G05B 15/02; G05B 19/404; G05B 2219/49079; G05B 2219/49099; G01H 1/00
See application file for complete search history.

(56) References Cited

U.S. PATENT DOCUMENTS

| | | | |
|---|---|---|---|
| 6,750,622 B2 | 6/2004 | Simizu et al. | |
| 6,933,692 B2 | 8/2005 | Gabriel et al. | |
| 7,005,819 B2 | 2/2006 | Takai et al. | |
| 7,795,825 B2 | 9/2010 | Williams | |
| 7,956,762 B2 | 6/2011 | Bailey et al. | |
| 7,996,163 B2 | 8/2011 | Bailey et al. | |
| 2008/0197800 A1* | 8/2008 | Bae | B60L 11/1803 318/807 |
| 2013/0013138 A1* | 1/2013 | Lu | B60L 3/0061 701/22 |

* cited by examiner

*Primary Examiner* — Vinh Nguyen
(74) *Attorney, Agent, or Firm* — Maristyn Law LLC; Lynda F. Kouroupis; David B. Kelley

(57) ABSTRACT

Systems, apparatus, and methods detect a current sensor error in an FOC electric machine system. A voltage command is monitored to detect the presence of an ac component that indicates that an error has occurred at a current sensor. For example, a sensor fault detection module can be configured to determine the deviation between an actual voltage command and an ideal voltage command to provide a complex deviation vector. By transforming the deviation vector to a reference frame rotating at the fundamental frequency of the command voltage, a dc component of the positive and negative sequences can be filtered, and their amplitudes determined. Error detection can be based on the total amplitude of the fundamental component, determined by positive and negative component amplitudes. Sensor error detection enables an FOC system to operate with two current sensors, rather than three, and provides a dedicated fault diagnostic for a current sensor.

9 Claims, 10 Drawing Sheets

COMPLEX FREQUENCY SPECTRUM OF COMMAND VOLTAGES AT 1500 rpm

DETECTION METHOD OF CURRENT SENSOR FAULTS IN THE E-DRIVE SYSTEM BY USING THE VOLTAGE COMMAND ERROR

FIELD OF INVENTION

This invention relates generally to electronic drive system diagnostics, and more particularly to fault detection for current sensors used for field-oriented machine control.

BACKGROUND OF INVENTION

Electric machines can be used to provide torque for various types of systems, such as, but not limited to, electric drive systems for electrified vehicles in which machine-generated torque is used for vehicle propulsion. Electric drive systems often rely on field-oriented techniques to control machine operation and torque output. Field-oriented control requires feedback current to be provided to a machine controller so that a determination can be made as to whether torque output needs to be adjusted, and any required adjustment can be performed. Accordingly, several current sensors are disposed to detect current and provide the necessary feedback. In a typical arrangement, two current sensors are used specifically for torque control, and a third current sensor is used to detect unintentional torque delivery. A diagnostic algorithm can be designed to sum the readings of all three sensors and compare the sum to a predetermined threshold to detect a torque delivery fault. While the checksum algorithm is designed to detect an error in torque control that leads to an unintentional torque delivery, in many cases it is relied on as a means for detecting a current sensor fault, since most, if not all, field-oriented control systems lack a dedicated fault diagnostic for a current sensor.

However, several problematic issues are associated with the use of a checksum method for sensor fault detection. For instance, there is no consistent approach for determining a threshold for the checksum comparison. Several factors can affect threshold determination, including sensor accuracy, signal noise level and the sensor current range, so a threshold can be sensor and application specific, and its determination can necessitate a time-consuming calibration process. In addition, the inclusion of a third sensor for enabling execution of a checksum algorithm increases the number of system components. When the vehicle drive system includes both a traction motor and a generator, two additional components are added, with each additional component increasing system cost while decreasing overall system reliability.

SUMMARY OF THE INVENTION

An example system can include an electric machine (EM), an energy conversion module (ECM) configured for energy exchange with the machine, one or more sensors configured to detect a phase current between the ECM and the electric machine, a controller configured to provide a voltage command configured to effect EM production of a desired torque, and a sensor fault detection module (SFDM) configured to use said voltage command to detect an error at the one or more sensors. In an example embodiment, the SFDM can be configured to monitor an ac component of the voltage command, and compare an attribute of the component to a predetermined threshold to detect the presence of a sensor fault. For example, the SFDM can be configured to compare the amplitude of a fundamental component of the voltage command to a predetermined threshold. In an example embodiment, the SFDM can be configured to determine a deviation between a voltage command provided by the controller and an ideal voltage command, and use the deviation to detect the presence of a sensor error.

An example SFDM can include an ac component monitoring module (ACMM) configured to monitor one or more ac components of a voltage command signal, and an error determination module (EDM) configured to make a fault determination based on the one or more ac components. In an example embodiment, the ACMM can be configured to isolate a fundamental component of a command voltage, and an EDM can be configured to compare the amplitude of the fundamental component to a predetermined threshold.

An example SFDM can include a voltage mapping module (VMM) configured to provide an ideal voltage command for an electric machine based on a command torque, and a deviation determination module (DDM) configured to determine a deviation between said ideal voltage command and an actual voltage command provided for an electric machine. By way of example, a deviation vector can be provided based on deviations in d-axis and q-axis voltages between ideal and actual voltage commands.

An example method for detecting the presence of a sensor error can include receiving a voltage command for an electric machine, monitoring an ac component of the voltage command, and using the ac component to determine whether a sensor error is present. By way of example, monitoring an ac component can comprise filtering or isolating a fundamental component of the ac component, and comparing the amplitude of the fundamental component to a predetermined threshold to determine whether a sensor error is present. A method can further include setting a fault flag to a fault condition when an error is detected.

An example method can comprise providing an ideal voltage command, receiving an actual voltage command, determining the deviation between the ideal and actual commands, and using the deviation to detect the presence of a sensor fault. By way of example, a method can include providing a deviation vector comprising the deviations between ideal and actual d-axis and q-axis voltage commands. Positive and negative sequences of the deviation vector voltage can be isolated and filtered, and amplitudes of the positive and negative components can be determined and summed to provide a total amplitude for a fundamental frequency component. The total amplitude can be compared to a predetermined threshold to determine whether a sensor fault exists.

DETAILED DESCRIPTION OF EXAMPLE EMBODIMENTS

Example embodiments of the invention are presented herein; however, the invention may be embodied in a variety of alternative forms, as will be apparent to those skilled in the art. To facilitate understanding of the invention, and provide a basis for the claims, various figures are included in the specification. The figures are not drawn to scale and related elements may be omitted so as to emphasize the novel features of the invention. Structural and functional details depicted in the figures are provided for the purpose of teaching the practice of the invention to those skilled in the art and are not to be interpreted as limitations. For example, modules and controllers for systems can be variously arranged and/or combined and may not be depicted in illustrations of example embodiments herein in order to better emphasize novel aspects of the invention. In addition, system components can be variously arranged as known in the art.

Figure 1:
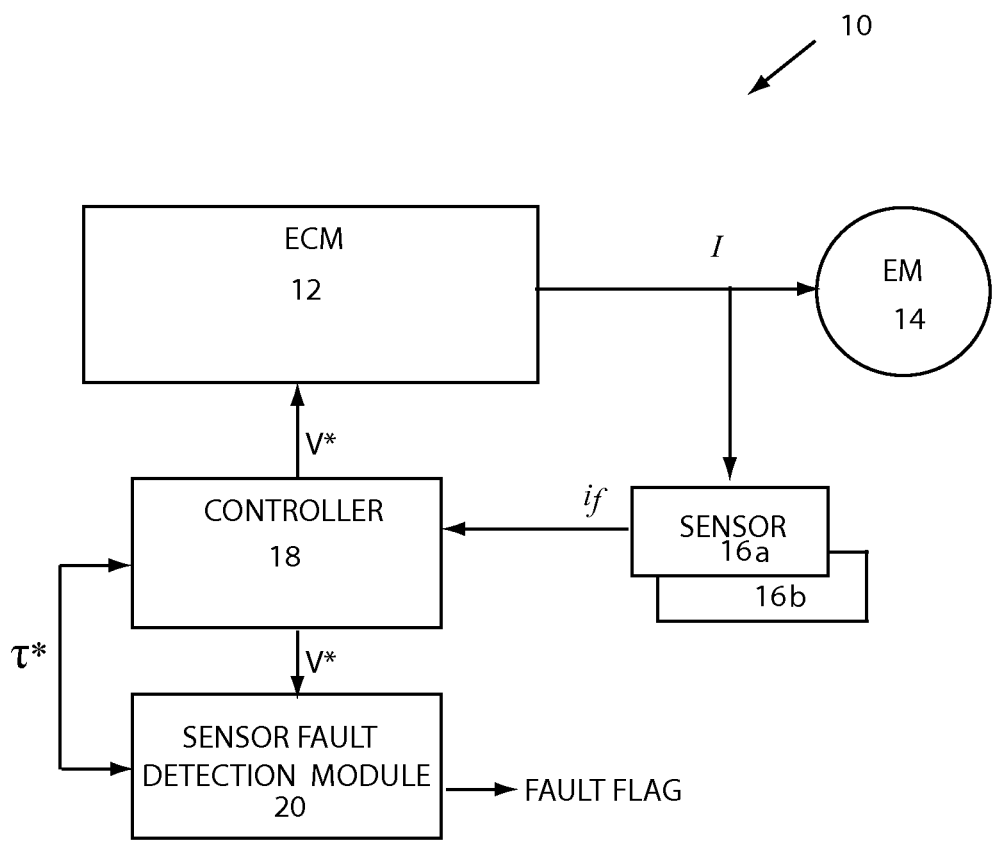
FIG. 1 shows an example system for sensor error detection.

FIG. 1 shows an electric machine system 10, which, by way of example, can be implemented as an electric drive system for an electrified vehicle such as a battery electric or hybrid electric vehicle. The example system 10 includes an energy conversion module (ECM) 12 configured to perform AC to DC, DC to AC and DC to DC conversions, and an electric machine (EM) 14, configured for energy exchange with the ECM 12, that can produce torque that can be used for vehicle propulsion. In an example embodiment, the ECM 12 can be configured to convert a DC voltage from an energy storage device (ESD) (not shown) such as a battery or capacitor bank to provide a three phase alternating current to the EM 14. One or more sensors 16 can be disposed to detect one or more phase currents provided to the EM 14 and provide feedback to a machine controller 18 configured to control EM 14 operation and torque output. In an example embodiment, the system 10 can include a first sensor 16a configured to detect a first "phase a" current provided to the EM 14, and a second sensor 16b configured to detect a second "phase b" current provided to the EM 14. The controller 18 can be communicatively coupled to a sensor fault detection module (SFDM) 20. In an example embodiment the SFDM 20 can be configured to use voltage command signals provided by the controller 18 to detect an error at the one or more sensors 16.

When the system 10 is employed as an electric drive system for an electrified vehicle, the ECU 12 can rely on a high voltage battery, such as, but not limited to, a 300V lithium-ion battery as an energy source. In an example embodiment, the ECM 12 can include a DC/DC converter (not shown) for stepping a received voltage up or down, and a DC/AC inverter (not shown) for converting a DC signal to an AC signal, and converting an AC signal to a DC signal. Thus, the ECM 12 can be configured to transfer energy from an ESD to an electric machine, such as an electric motor, and can be configured to transfer energy from an electric machine, such as a generator, to an ESD. By way of example, but not limitation, the EM 14 can be in the form of a permanent magnet synchronous motor (PMSM) operated under field-oriented control (FOC).

In an example embodiment, the controller 18 voltage command can be applied to the EM 14 to through an ECM inverter configured to provide a three-phase current to the EM 14. The one or more sensors 16 can be configured to provide phase current feedback that can be used by the controller 18 for EM 14 torque control in accordance with FOC techniques.

As known in the art, current feedback plays a significant role in FOC. Referring to FIG. 1, the controller 18 can receive a torque command $\tau^*$ and feedback current $i_f$ and use both to provide a voltage command $V^*$. Errors at the sensors 16 can result in erroneous current feedback, which in turn, causes the controller 18 to provide erroneous voltage commands that can adversely affect torque control. Incorrect torque delivery can noticeably affect vehicle performance, much to an operator's chagrin.

The effects of sensor error on feedback current can be expressed analytically. In general, there are two types of current sensor errors, offset errors, in which zero current input results in a non-zero voltage output, and gain errors, in which the gain is some value other than one, so that an incremental change in current input does not produce the correct incremental change in sensor voltage output. A sensor fault can cause either or both types of errors, and both types of errors can contribute to voltage command and torque control errors. As known in the art, FOC techniques use both stationary and rotating frames of reference, and perform transformations between the two for current control operations. In the stationary frame, phase currents provided as feedback by current sensors can be expressed as:

$$i_{a\_read}^s = k_a i_{a\_real}^s + I_{a\_offset}$$
$$i_{b\_read}^s = k_b i_{b\_real}^s + I_{b\_offset}$$
$$i_{c\_read}^s = -i_{c\_read}^s - i_{b\_read}^s \quad (1)$$

where:
$i_{a\_read}^s$ is the phase a current read by sensor a
$i_{b\_read}^s$ is the phase b current read by sensor b
$i_{c\_read}^s$ is the phase c current calculated by sensor c
$k_a$ is the gain of sensor a
$k_b$ is the gain of sensor b
$i_{a\_real}^s$ is the real or actual phase a current
$i_{b\_real}^s$ is the real or actual phase b current
$I_{a\_offset}$ is the offset error of sensor a
$I_{b\_offset}$ is the offset error of sensor b Given the expressions above, the measured errors of each phase current can be expressed as follows:

$$\delta i_a^s = i_{a\_read}^s - i_{a\_real}^s = (k_a - 1)i_{a\_real}^s + I_{a\_offset}$$
$$\delta i_b^s = i_{b\_read}^s - i_{b\_real}^s = (k_b - 1)i_{b\_real}^s + I_{b\_offset}$$
$$\delta i_c^s = i_{c\_read}^s - i_{c\_real}^s = (1 - k_a)i_{a\_real}^s + (1 - k_b)i_{b\_real}^s - I_{a\_offset} - I_{b\_offset} \quad (2)$$

When the coordinate reference frame is transformed from the stationary x-y frame to the rotating d-q frame, the above errors in phase current can be transformed to the following errors in d- and q-axis currents:

$$\delta i_d^r = I_{offset}\cos(\omega t - \varphi_{d\_off}) + I_{neg}\cos\left(2\omega t - \frac{\pi}{6}\right) + \frac{(k_a + k_b\ 2)I}{2}$$

$$\delta i_q^r = I_{offset}\cos(\omega t - \varphi_{q\_off}) + I_{neg}\cos\left(2\omega t + \frac{\pi}{3}\right) + \frac{(k_a - k_b)I}{2\sqrt{3}}$$

where;

$$I_{offset} = \sqrt{I_{a\_offset}^2 + (I_{a\_offset} + 2I_{b\_offset})^2}$$

$$\varphi_{d\_off} = \tan^{-1}\left(\frac{I_{a\_offset} + 2I_{b\_offset}}{I_{a\_offset}}\right)$$

-continued $$I_{neg} = \sqrt{\left[\frac{(k_a - k_b)I}{2}\right]^2 + \left[\frac{(k_a - k_b)I}{2\sqrt{3}}\right]^2}$$

$$\varphi_{q\_off} = \tan^{-1}\left(\frac{-I_{a\_offset}}{I_{a\_offset} + 2I_{b\_offset}}\right)$$

$$\varphi_{d\_off} - \varphi_{q\_off} =$$

$$\tan^{-1}\left(\frac{I_{a\_offset} + 2I_{b\_offset}}{I_{a\_offset}}\right) - \tan^{-1}\left(\frac{-I_{a\_offset}}{I_{a\_offset} | 2I_{b\_offset}}\right) = \frac{\pi}{2}$$

As can be seen from (3), the d-axis and q-axis current errors due to sensor a and sensor b gain and offset characteristics include a dc component as well as fundamental and second harmonic ac components. When feedback current includes errors having ac components, voltage drive signals provided to the ECM 12 can also include ac components.

Figure 2A:
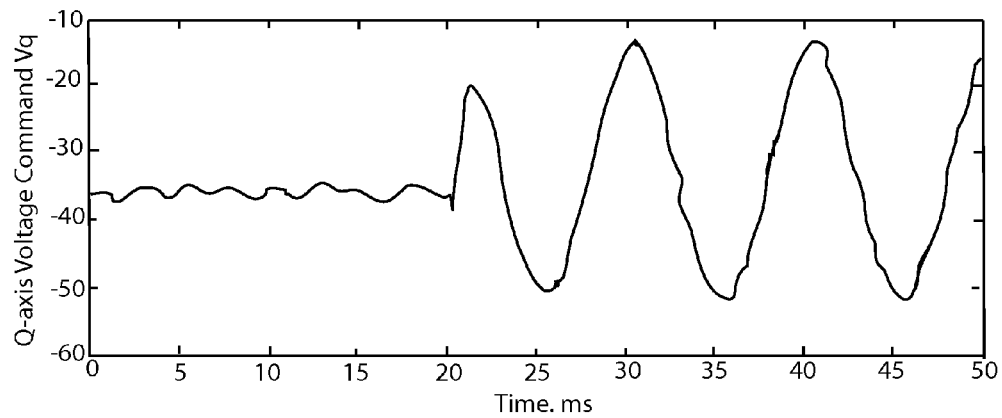
FIG. 2A shows a q-axis voltage command during normal and fault operation.
Figure 2B:
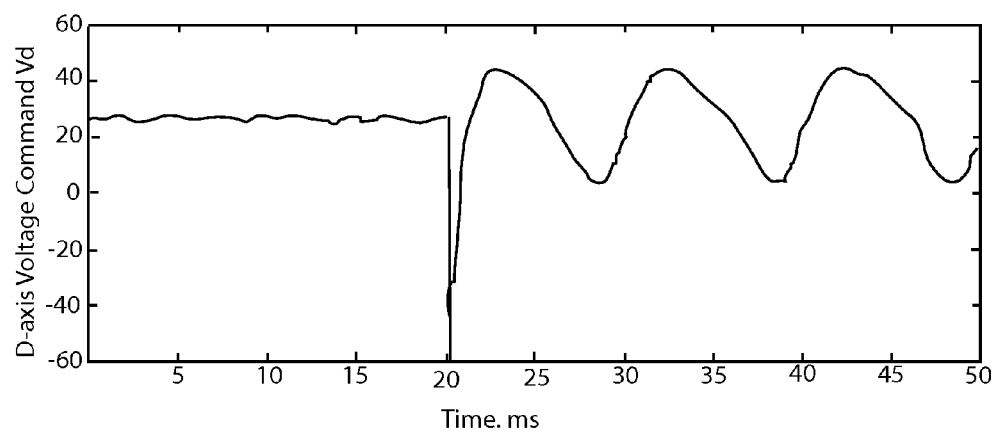
FIG. 2B. shows a d-axis voltage command during normal and fault operation.

As an example of the effects of sensor error on voltage command signals, FIG. 2A shows simulation results for q-axis voltage versus time during normal operation, and during sensor fault conditions. FIG. 2B shows simulation results for d-axis voltage over time during normal operating conditions and during sensor fault conditions. As can be observed from the graphs, during normal operation, voltage commands remain fairly constant, but during sensor fault conditions, the voltage command signals fluctuate widely about their dc values in a sinusoidal waveform. The present invention can use this ac fluctuation to detect that a fault exists at a current sensor.

Figure 3:
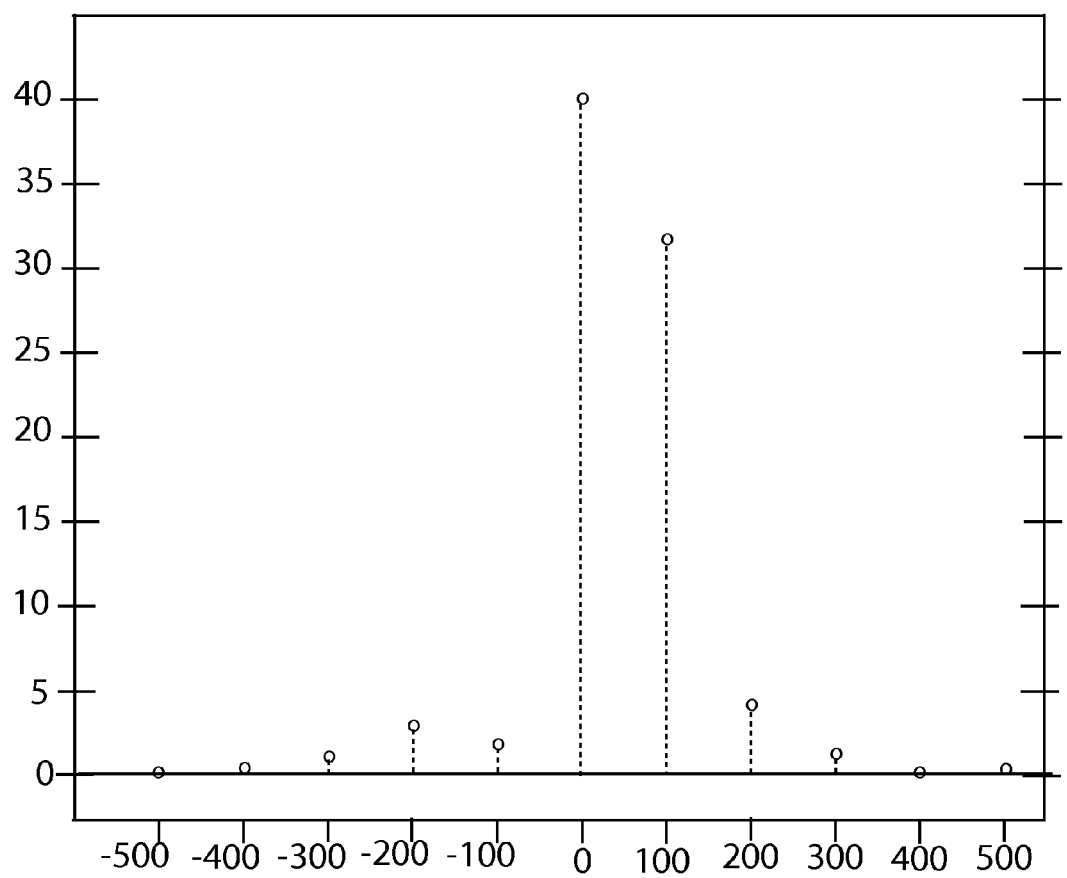
FIG. 3. shows a complex frequency spectrum of command voltages.
Figure 4A:
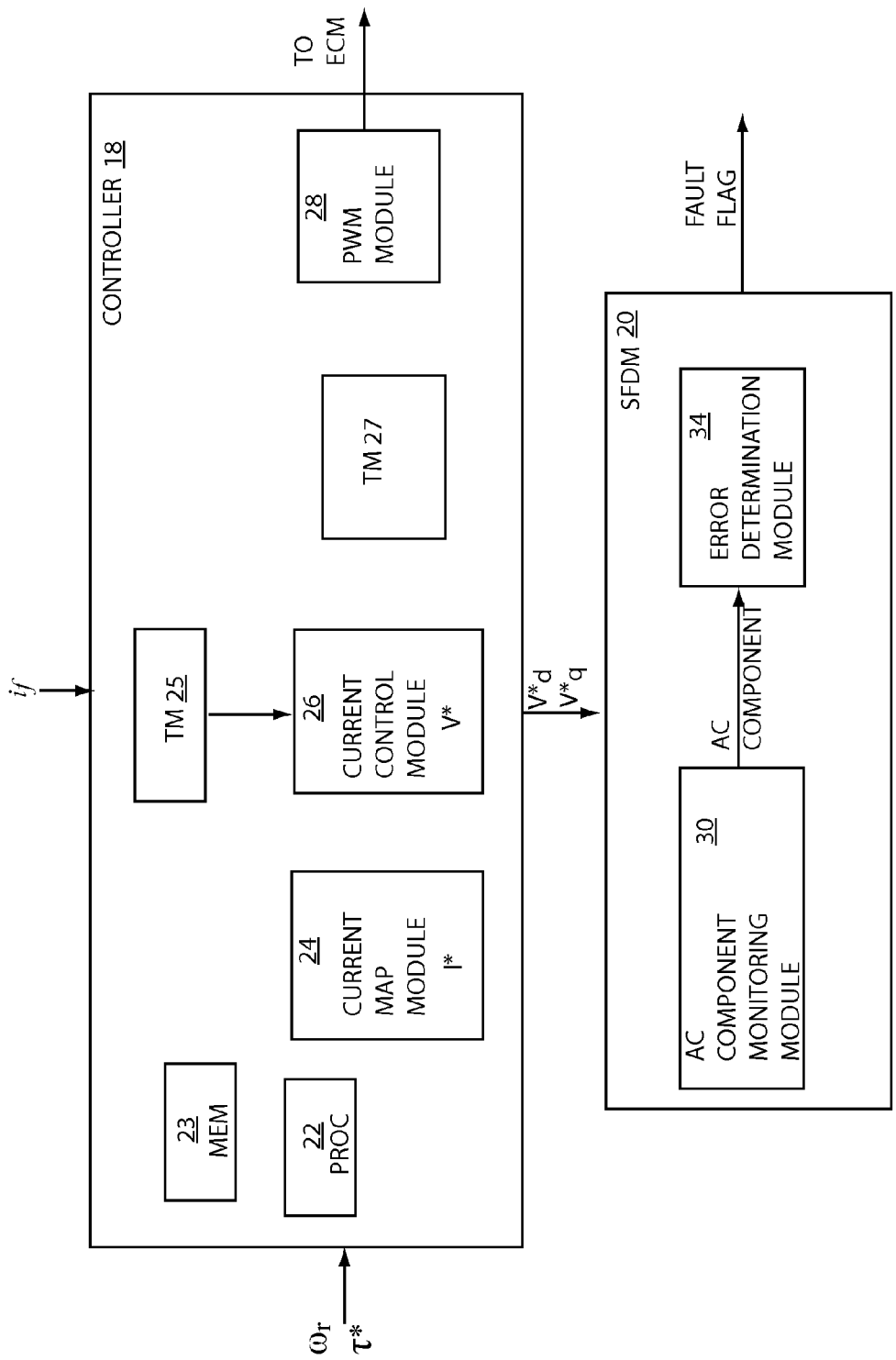
FIG. 4A shows an example sensor fault detection module.

FIG. 3 shows an example complex frequency spectrum of voltage commands at 1500 RPM. While the dc component may be the most prominent, noticeable power can be carried in the fundamental frequency and second harmonic components of voltage command signals during sensor fault conditions. The fundamental and second harmonic components can include both positive and negative sequence components, To improve machine torque control, the SFDM 20 is configured to detect and flag the presence of a fault or error condition at any of current sensors 16. FIG. 4A shows a controller 18 communicatively coupled to an example SFDM 20. The controller 18 can include a processor 22 configured to perform processing functions associated with the operation of the controller 18 and/or the SFDM 20. By way of example, the processor 22 can be a pre-programmed device configured with the logic and computing/processing capabilities required to perform the functions of the controller 18. In an example embodiment, the processor 22 can be configured to execute logic for algorithms performed by the controller 18 and the SFDM 20, which may include hardware, software, firmware, and/or any combination thereof. A memory 25 can be coupled to the processor 22 and can include read-only memory (ROM) for storing instructions for the processor 22, as well as random access memory (RAM) for use during computing and processing operations.

The controller 18 can include a current mapping module (CMM) 24, a current control module (CCM) 26, and a pulse width modulation module (PWMM) 28. The CMM 24 can comprise a stored array or table of command current values associated with particular command torques and rotational velocities. For example, the stored array may be stored at the memory 25, at a separate storage device, or at the CMM 24. In an example embodiment, the CMM 24 can be configured to receive a torque command τ* for the EM 14 from a vehicle control unit (VCU) (not shown) or an electronic control unit (ECU) (not shown), for example via a vehicle CAN bus to which the controller 18 can be coupled. The CMM 24 can also be configured to receive the EM 14 rotational velocity $\omega_r$, for example, from a rotational position sensor at the EM 14, from a VCU or ECU coupled to a rotational position sensor, or other means. Using the machine operating parameters $\omega_r$ and τ*, the CMM can be configured to provide, based on the stored array of command current values, a command current I*, which, by way of example, can be expressed in terms of I*$_q$ and I*$_d$ in a rotating frame of reference as indicated by (4) below, that is expected to result in the EM 14 production of the command torque.

$$I^* = I^*_d \hat{d} + I^*_q \hat{q} \quad (4)$$

In an example embodiment, the CCM 26 can be configured to receive command current I* and EM 14 current feedback $i_f$, to provide a corresponding voltage command V* for the EM 14. The voltage command V* can comprise components V*$_d$, and V*$_q$ for the d- and q-axes respectively, as shown in (5) below.

$$V^* = V^*_d \hat{d} + V^*_q \hat{q} \quad (5)$$

The voltage command V* can be provided to the ECU 12. In response, the ECU 12 can apply the voltage command V* to the EM 14 through phase current. In an example system, a transform module TM 25 can be configured to receive the feedback phase currents $i_a$ and $i_b$ detected by sensors 16a, b and transform them to feedback currents $i_d$ and $i_q$ in a rotating reference frame. The CCM 26 can be configured to receive the currents $i_d$ and $i_q$ and determine the difference between them and the current commands I*$_d$ and I*$_q$, to provide differences $\Delta i_d$ and $\Delta i_q$. The CCM 26 can be configured to provide voltage commands V*$_d$ and V*$_q$ based on $\Delta i_d$ and $\Delta i_q$. In an example embodiment, the voltage commands V*$_d$ and V*$_q$ can be transformed to a stationary frame of reference at transformation module 27 and provided to the PWMM 28. The PWMM 28 can be configured to modulate the voltage commands through pulse width modulation to provide drive signals for an ECM 12 inverter (not shown) configured to provide alternating current to the EM 14. The transformations conducted by the transform modules 25 and 27 between two- and three-phase coordinate systems, and between stationary and rotational frames of reference can be performed using Park and Clark transformations as known in the art and practiced for vector or field-oriented control for electric machines.

The SFDM 20 can include an ac component monitoring module (ACMM) 30 and an error determination module (EDM) 34. The ACMM 30 can be configured to isolate one or more ac components of the voltage command V* provided by the CCM 26. By way of example, the ACMM 30 can be configured to isolate one or more ac components from the V*$_d$ command and one or more components of the V*$_q$ command. In an exemplary embodiment, a fundamental component can be isolated. The EDM 34 can be configured to use the extracted ac component to determine whether a sensor error is present. In an example embodiment, the amplitude of an ac component can be compared to a predetermined threshold to make this determination.

Figure 4B:
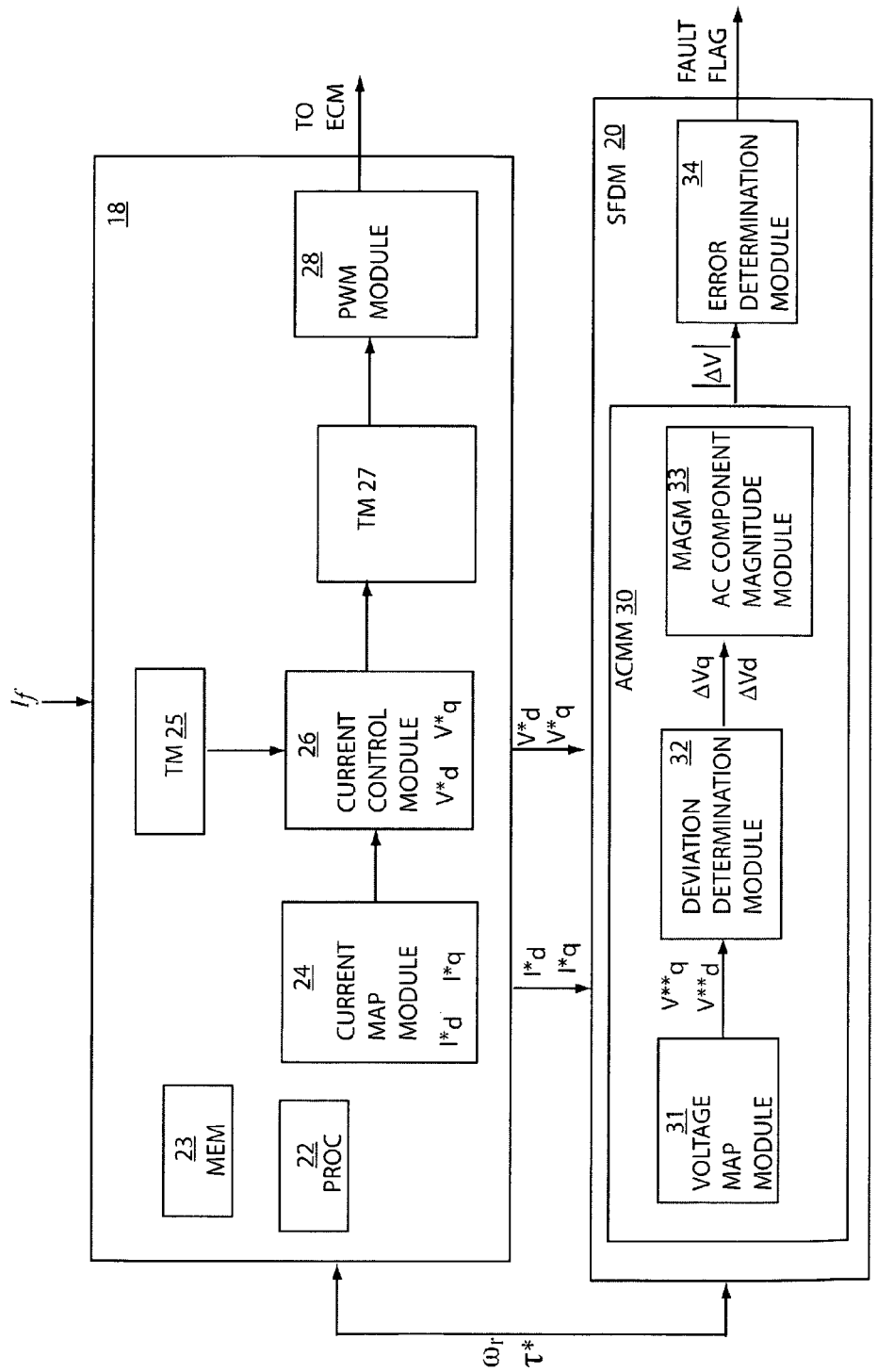
FIG. 4B shows an example sensor fault detection module.

FIG. 4B shows an example embodiment of the SFDM 20. By way of example, but not limitation, the ACMM 30 can comprise a voltage mapping module (VMM) 31, a deviation determination module (DDM) 32, and an ac component magnitude module (MAGM) 33. In an example embodiment, the VMM 31 can comprise a stored table or array associating particular torque commands with particular ideal voltage commands V$_d$ and V$_q$. The ideal voltage commands are those voltages that, when applied to the EM 14 through the ECM 12, are expected to cause the EM 14 to produce the desired command torque. By way of example, the ideal voltages can be stored at the VMM 31, or at the memory 25. The ideal voltage commands vary with the machine operation conditions. In an example embodiment, the VMM 31 can be configured to receive operational parameters such as ideal current commands I*$_d$ and I*$_q$ from the CMM 24, the command torque τ*, and the EM 14 rotational velocity ω$_r$, and select an ideal voltage command based on the parameters. The VMM 31 can be configured to provide an ideal direct axis voltage V$_d$, and an ideal quadrature axis voltage V$_q$ associated with the parameters from the voltages stored at the table of ideal voltages. For values of operational parameters that are not explicitly included in the table, the VMM 31 can be configured to execute a scheme such as, but not limited to, an interpolation algorithm, a rounding algorithm, or other process for selecting or calculating an ideal voltage from the stored table. By way of example, the VMM 31 can comprise logic instructions that can be executed by the processor 22, or a VMM 31 dedicated processor to provide an ideal voltage.

The DDM 32 can be configured to determine the difference or deviation between ideal command voltages and actual command voltages. For example, the DDM 32 can be configured to receive ideal voltage command components V$_d$ and V$_q$ from the VMM 31, and to receive actual voltage command components V*$_d$ and V*$_q$ provided by the CCM 26 and determine the difference between them. The DDM 32 can be configured to provide a ΔV$_d$, representing the difference between the ideal and actual command d-axis voltages, and ΔV$_q$ representing the difference between the ideal and actual command q-axis voltages. As demonstrated analytically above, sensor errors can generate ac components in sensor output, and those ac components can be incorporated in the voltage commands provided to the EM 14. As a result, the deviation between ideal and voltage commands can comprise ac components such as, but not limited to, a fundamental and other harmonic components. In an example embodiment, the DDM 332 can provide a complex vector $\Delta \bar{V}_t$ having a real component ΔV$_d$ and imaginary component ΔV$_v$ as expressed by (6) below:

$$\Delta \bar{V}_e = \Delta V_d + j\Delta V_q \quad (6)$$

Figure 4C:
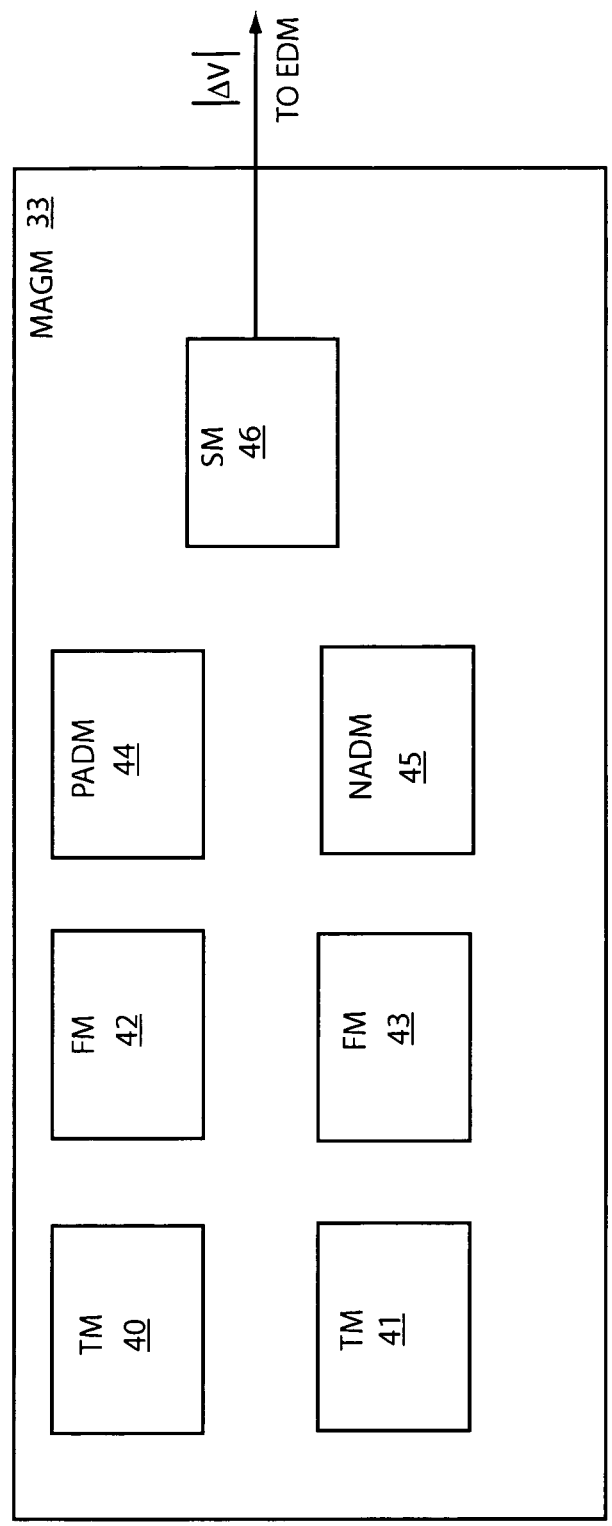
FIG. 4C shows an example sensor fault detection module.

By way of example, but not limitation, one or more filters can be used to isolate particular components of the ac signal. As described previously herein, specific harmonic components can be isolated, including positive and negative component sequences. In an example embodiment, the MAGM 33 can be configured to receive the complex vector $\Delta \bar{V}_s$ and provide the magnitude of its fundamental frequency component. FIG. 4C shows an example configuration for the MAGM 33, which can comprise hardware, software, firmware or some combination thereof. For example, the MAGM 33 can comprise software modules having encoded logic instructions for implementing the calculations and algorithms associated with providing the magnitude of an ac component. By way of example, the instructions can be executed by the processor 22 or a processor (not shown) at the MAGM 33. The example MAGM 33 can include a transformation module TM 40, a filter module (FM) 42, and positive amplitude determination module (PADM) 44. The TM 40 can be configured to receive the complex vector $\Delta \bar{V}_s$ and transform it to a vector $\Delta \bar{V}_p$ in a reference frame rotating at the fundamental frequency of $\Delta \bar{V}_s$ in the positive direction. By way of example, $\Delta \bar{V}_p$ can be expressed by (7) below:

$$\Delta \bar{V}_p = \Delta \bar{V}_s \cdot e^{-j\theta_e} \quad (7)$$

As a result of this transformation, the positive fundamental component of $\Delta \bar{V}_s$ becomes the dc component of $\Delta \bar{V}_p$. The FM 42 can be configured to receive the positive vector $\Delta \bar{V}_p$ and extract its dc component. For example, the FM 42 can comprise a low-pass filter that can be configured to extract the dc component of $\Delta \bar{V}_p$ in order to Isolate the positive fundamental component of $\Delta \bar{V}_s$. The positive fundamental component of $\Delta \bar{V}_s$ can be expressed as shown by (8) below:

$$\Delta \bar{V}_p = \Delta \bar{V}_{p1d} j \bar{V}_{p1q} \quad (8)$$

The PADM 44 can be configured to receive $\Delta \bar{V}_{p1}$, and determine its magnitude. In an example embodiment, the PADM 44 can be configured to calculate a magnitude using the d-axis and q-axis components of the vector $\Delta \bar{V}_{p1}$, as shown by (9) below:

$$|\Delta \bar{V}_{p1}| = \sqrt{\Delta \bar{V}_{p1d}^2 + \Delta \bar{V}_{p1q}^3} \quad (9)$$

The MAGM 33 can be configured to use a negative sequence component of the signal as well. In an example embodiment, the MAGM 33 can further include a TM 41 configured to transform the complex vector $\Delta \bar{V}_s$ to a vector $\Delta \bar{V}_n$ in a reference frame rotating at the fundamental frequency in the negative direction. The vector $\Delta \bar{V}_n$ can be expressed by (10) below:

$$\Delta \bar{V}_n = \Delta \bar{V}_s \cdot e^{j\theta_e} \quad (10)$$

An FM 43 can comprise a low pass filter configured to pass the dc component of the vector $\Delta \bar{V}_n$ to provide the negative fundamental component $\Delta \bar{V}_{n1}$ of the complex vector $\Delta \bar{V}_s$. The negative fundamental component $\Delta V_{n1}$ can be expressed by (9) below:

$$|\Delta \bar{V}_{p1}| = \sqrt{\Delta \bar{V}_{p1d}^2 + \Delta \bar{V}_{p1q}^2} \quad (9)$$

A negative amplitude determination module (NADM) 45 can be configured to receive the negative fundamental vector $\Delta \bar{V}_{n1}$ and determine its amplitude. In an example embodiment, the NADM 45 can be configured to determine the magnitude or amplitude of the vector $\Delta \bar{V}_{n1}$ by implementing (12) below:

$$|\Delta \bar{V}_{n1}| = \sqrt{\Delta \bar{V}_{n1d}^2 + \Delta \bar{V}_{n1q}^2} \quad (12)$$

Thus, the MAGM 33 can be configured to determine the amplitudes of the positive fundamental component and the negative fundamental component of the complex vector as $\Delta \bar{V}_s$ composed of the d-axis and q-axis deviations between ideal and actual voltage commands.

A summation module (SM) 46 can be configures to sum the amplitudes of positive and negative components to provide a magnitude for an ac component. For example, to determine the amplitude or magnitude of the fundamental component of the deviation vector $\Delta \bar{V}_s$, represented by $|\Delta \bar{V}_1|$, the SM 46 can be configured to add the amplitudes of the negative and positive components of the fundamental component, as shown by (13) below:

$$|\Delta \bar{V}_1| = |\Delta \bar{V}_{p1}| + |\Delta \bar{V}_{n1}| \quad (13)$$

The above discussion is directed to providing an amplitude for a fundamental component of an ac signal. However, it is contemplated that magnitudes for other ac components can also be determined by the MAGM 33; for example a magnitude for a second harmonic component can be determined. In an example embodiment, the FM 42 and FM 43 can be configured to extract a harmonic component, rather than a dc component, of a positive sequence and negative sequence, respectively, with the PADM 44 and the NADM 45 configured to determine the amplitudes of the extracted positive and negative harmonic components, respectively.

The EDM 34 can be configured to use the magnitude or amplitude of an ac component to determine whether a fault exists at a current sensor, such as sensor 16a or 16b. When the sensors 16 are functioning as ideal sensors with no errors, the magnitude $|\Delta \overline{V}_1|$ of the fundamental component of $\Delta \overline{V}_s$ should be zero. Thus, a non-zero magnitude can indicate the presence of a sensor fault. However, noise factors can also result in a determination of a non-zero magnitude for $|\Delta \overline{V}_1|$. Thus, in an exemplary embodiment the EDM 34 can be configured to compare the magnitude to a predetermined threshold to determine the presence of a sensor fault. For example, the EDM 34 can be configured to compare the magnitude $|\Delta \overline{V}_1|$ to a threshold Vsh1. If $|\Delta \overline{V}_1|$ exceeds $V_{sh1}$, the EDM 34 can be configured to set a fault flag to indicate a fault condition, in an example embodiment, in order to mitigate noise effects, the EDM 34 can be configured for a hysteresis-controlled output. For example, the EDM 34 can further be configured to compare the magnitude $|\Delta \overline{V}_2|$ to a second threshold $V_{sh2}$. If $|\Delta \overline{V}_1|$ falls below $V_{sh2}$, a fault flag can be set to Indicate that no fault is present. It is also contemplated that specific thresholds can be established for particular components. For example, a first threshold for a fundamental component magnitude can be established, while a different threshold can be established for a different harmonic component magnitude. It is contemplated that fault determination can take info consideration the results of one or more magnitude comparisons. In an example embodiment, the EDM 34 can be communicatively coupled to a diagnostics module, for example at an engine control unit (ECU) or vehicle control unit (VCU) or dashboard display configured to receive a fault indication from the EDM 34 and provide a fault indicator display for an operator and/or a fault diagnostics code for service personnel.

Figure 5:
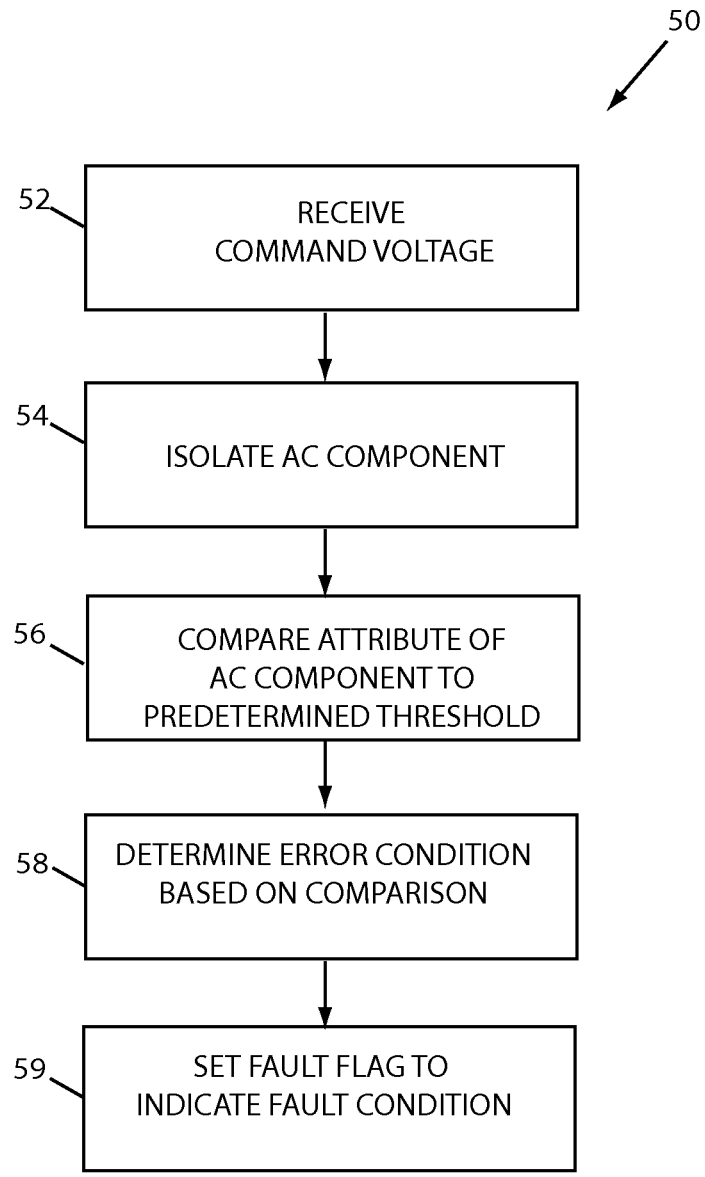
FIG. 5 shows an example method for detecting a sensor fault.
Figure 6:
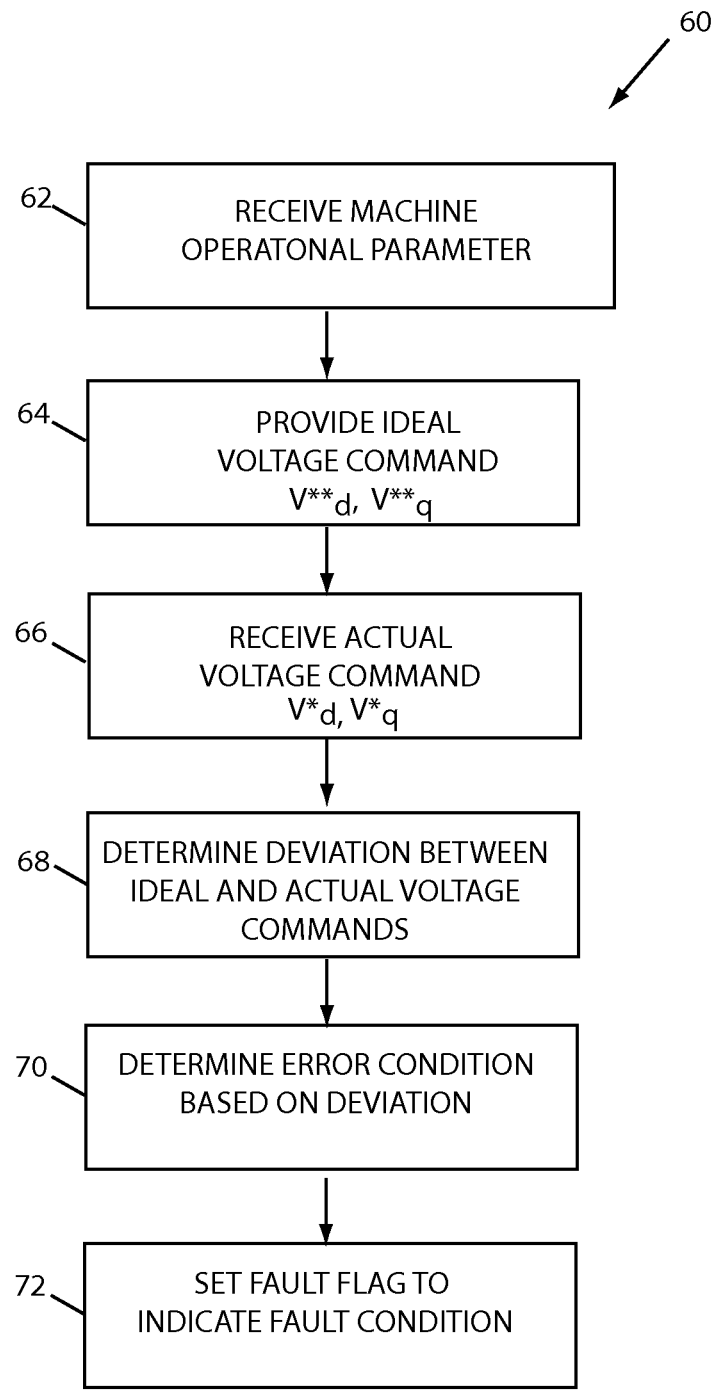
FIG. 6 shows an example method for detecting a sensor fault.

FIG. 5 shows an example method 50 for detecting and reporting a current sensor fault. At block 52, a command voltage can be received. For example, the ACMM 30 can receive a command voltage V* provided by the controller 18. By way of example, the ACMM 30 can receive $V^*_d$ and $V^*_q$, the d- and q-axis components of the command voltage V*. At block 54, one or more ac components of the command voltage can be isolated. For example, the ACMM 30 can isolate a fundamental component of the command voltage. At block 56, an attribute of the ac component can be compared to a predetermined threshold. For example, the amplitude of a fundamental component can be compared to a predetermined threshold. Attributes of more than one ac component can be compared, and various predetermined thresholds can be established. In addition, it is contemplated that attributes other than amplitude can be used. At block 58, a fault or no-fault condition can be determined based on the comparison. For example, if the amplitude of an ac component is less than the predetermined threshold, a determination can be made that no fault exists. If the amplitude of an ac component exceeds a predetermined threshold, then a determination can be made that a sensor fault is present. A fault determination can be based on a single component comparison, or based on the comparison results of more than one ac component. At block 59, a fault flag can be set to indicate whether a fault is detected. For example, when a determination is made that a sensor fault exists, a fault flag can be set to 1, and a signal can be provided to a diagnostics module. A fault flag can be set to 0 when no fault is detected.

Figure 8:
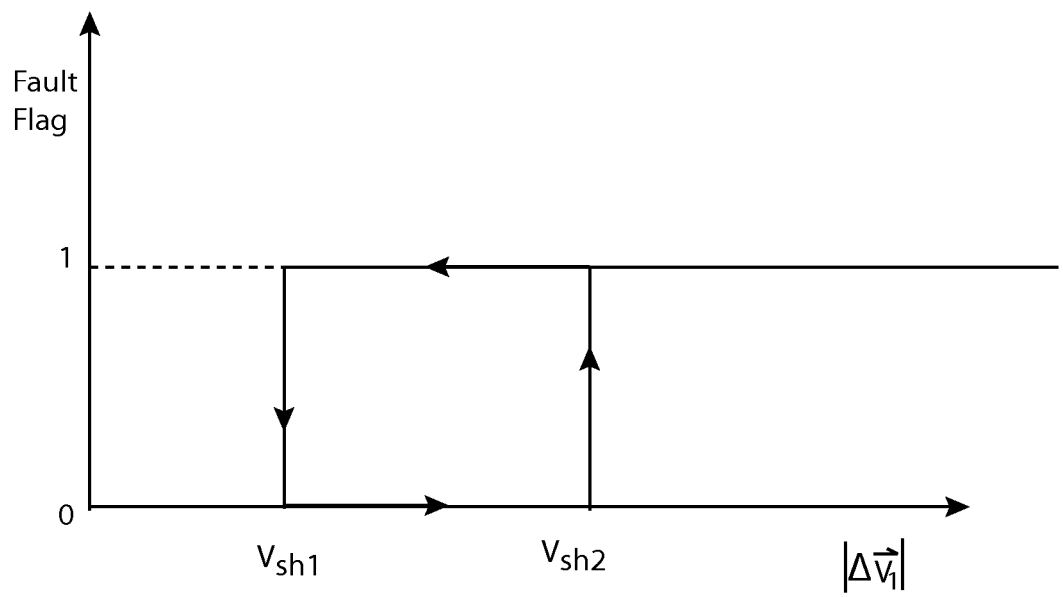
FIG. 8 shows an example hysteresis fault defection response.

FIG. 8 shows an example method 60 for detecting a fault condition at one or more current sensors. The method 60 provides an example process for isolating an ac component of a voltage command signal. At block 62, one or more operational parameters can be received. By way of example, but not limitation, the SFDM 20 can receive a torque command τ* for the EM 14 from the controller 18 or a vehicle ECU or VCU. In addition, the SFDM 20 can receive the rotational velocity $\omega_r$ of the EM 14 from the controller 18, a position or velocity sensor at the EM 14, an ECU or VCU. The SFDM 20 can further receive the command currents $I^*_d$ and $I^*_q$ provided by the CMM 26.

At block 64, the SFDM 20 can provide ideal voltage commands $VII_q$ and $V^{}_d$ based on the received operational parameters. For example, the VMM 31 can be configured to select a stored ideal voltage value based on the received ideal current commands, torque command and EM 14 rotational velocity. At block 68, an actual voltage command provided for an electrical machine can be received. For example, the DDM 32** can receive $V^*_q$ and $V^*_d$ from the CCM 26. At block 68, the difference between ideal and actual voltage commands can be determined. For example, the DDM 32 can determine the differences $\Delta V_q$ and $\Delta V_d$ between ideal and actual q-axis and d-axis voltage commands. During steady state conditions, the voltage commands $V^*_d$ and $V^*_q$ remain essentially constant, and should be equal to the ideal voltage commands $V^{}_d$ and $V^{}_q$ when current sensors are operating normally. However, when faults or errors occur at the sensors, the actual voltage commands will deviate from the ideal voltage commands. As shown above by (3), sensor faults Induce ac components info current sensor readings, and those ac components can become incorporated in the voltage commands that are based on the erroneous sensor readings. Those ac components cause the actual voltage commands to differ from the ideal voltage commands provided by the VMM 31. In an example embodiment, the deviations between the ideal and actual voltage commands can be expressed as a deviation vector. For example, the DDM 32 can provide the complex vector $\Delta \overline{V}_i$ represented by (6). At block 70 a determination can be made as to whether a current sensor fault exists. By way of example, the EDM 34 can use the deviation determined by the DDM 32 to detect the presence of a fault. In an example embodiment, the EDM 34 can compare an aspect of the deviation to a predetermined threshold to make its determination. As discussed above, a comparison process can include comparisons with one or more thresholds. At block 72, a fault flag can be set to indicate whether a fault is detected. For example, when a determination is made that a sensor fault exists, the EDM 34 can set a fault flag to indicate that a sensor error is defected. By way of example, a fault signal can be provided to a diagnostics module.

Figure 7:
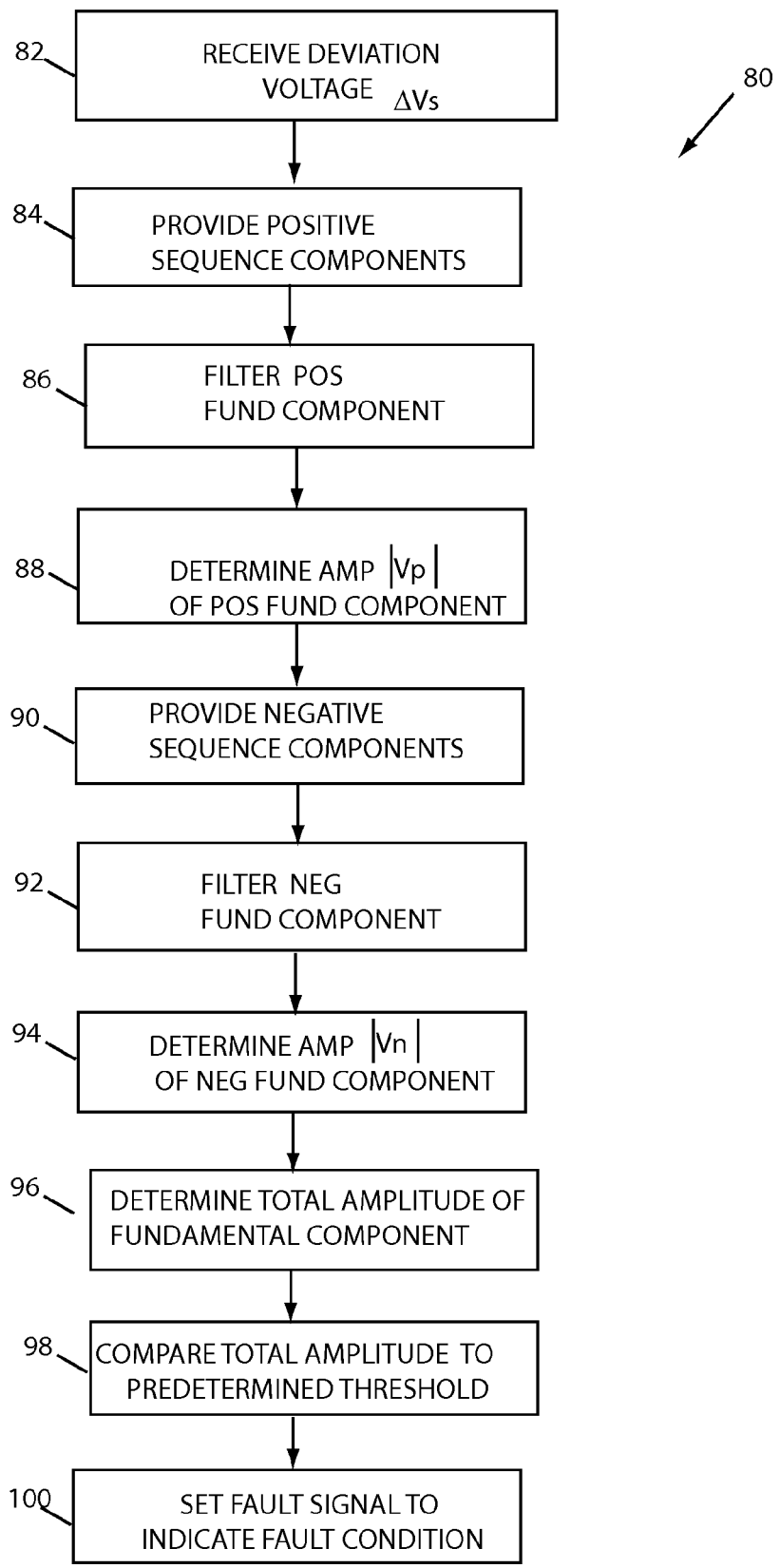
FIG. 7 shows an example method for detecting a sensor fault.

FIG. 7 shows an example method 80 that can be implemented to determine whether an error condition exists. At block 82, a deviation between an actual and an ideal voltage command can be received. For example, the MAGM 3311411 can receive the deviations $\Delta V_d$ and $\Delta V_q$ from the DDM 32 in the form of the complex deviation vector $\Delta \overline{V}_s$. At block 84, the positive sequence components of the complex deviation vector can be provided. For example, the TM 40 can transform the vector $\Delta \overline{V}_s$ to the vector $\Delta \overline{V}_p$ in a reference frame rotating at a fundamental frequency in a positive direction as expressed by (7). At block 86, a positive fundamental component of the deviation vector $\Delta \overline{V}_s$ can be extracted. For example, the FM 42 can receive $\Delta \overline{V}_p$ and filter out its dc component $\Delta \overline{V}_{p1}$ as expressed by (8) above. At block 88, the magnitude of the positive fundamental component $|\Delta \overline{V}_{p1}|$ can be determined. For example, the PADM 44 can determine the magnitude $\Delta \overline{V}_{p1}|$ by implementing (9) above.

A similar process can be performed for the negative sequence of the complex deviation vector. At block 90, the negative sequence of the complex deviation vector can be isolated. For example, the TM 41 can transform the vector $\Delta \overline{V}_s$ to the vector $\Delta \overline{V}_n$ rotating at a fundamental frequency in the negative direction expressed by (10) above. At block 92, the negative fundamental component of the deviation vector $\Delta \bar{V}_n$ can be extracted. In an example embodiment, the FM 43 can filter the dc component of $\Delta \bar{V}_n$ to provide the negative fundamental component $\Delta \bar{V}_{n1}$ as expressed by (11) above. At block 94, the amplitude of the negative fundamental component can be determined. For example, the NADM 45 can be configured to provide the magnitude $|\Delta \bar{V}_{n1}|$ by performing the operations described by (12) above. At block 96 the total amplitude of the fundamental component can be determined. For example, the SM 46 can receive the amplitude of the positive fundamental component, $|\Delta \bar{V}_{p1}|$, and the amplitude of the negative fundamental component, $|\Delta \bar{V}_{n1}|$, and add them according to (13) above to provide the fundamental component amplitude $|\Delta \bar{V}_1|$. Once the total amplitude of the fundamental component is provided, it can be used to determine whether a fault condition is present at a current sensor. For example, at block 98 the fundamental component amplitude $|\Delta \bar{V}_1|$ can be compared to a predetermined threshold to determine whether a fault condition exists. As discussed previously herein, a hysteresis process can be implemented in order to mitigate the effects of noise on the fault detection process. By way of example, but not limitation, the EDM 34 can compare $|\Delta \bar{V}_1|$ a first threshold $V_{sh1}$, and a second threshold, $V_{sh2}$. If $|\Delta \bar{V}_1|$ is greater than $V_{sh1}$, the EDM 34 can determine that a fault condition exists, if $|\Delta \bar{V}_1|$ is less than $V_{sh2}$, the EDM 34 can determine that no fault condition exists. At block 100, a fault signal can be set to indicate the fault status. For example, the EDM 34 can set a fault signal to 1 when a fault is detected, and to 0 when no fault is detected, as shown in FIG. 8.

While methods 60 and 80 provide examples of fault detection processes that can be implemented, it is contemplated, that the invention can be practiced in a variety of ways. For example, ac components other than the fundamental frequency component can be extracted and used to determine whether a sensor fault is present.

In an example embodiment, the SFDM 20 can be communicatively coupled to a diagnostics module at a vehicle, enabling a fault condition detected at the EDM 34 to be reported to the diagnostics module and brought to the attention of an operator or service technician.

In the past, three sensors were necessary in an FOC system, two for torque control, and one for detection of unintentional torque delivery. The methods and apparatus of the invention eliminate the need for a third sensor, enabling an FOC system to operate with only two sensors. By dispensing with the third sensor, overall system cost can be reduced, while overall system reliability can be improved. In addition, the invention eliminates the need for experimentation in determining a checksum threshold for torque delivery fault detection, and provides a universal solution that can be easily implemented without regard to specific individual sensor characteristics.

Having a specific fault flag and diagnostic for a current sensor, rather than just a fault flag for torque delivery errors, expedites the fault resolution process since it obviates the need for a service technician to investigate potential error sources other than the sensors, such as a malfunctioning machine controller. Likewise, should a torque misdelivery occur when no sensor fault condition is detected, it eliminates the sensors as a possible cause, saving the time and expense of testing and/or replacing the current sensors Example embodiments have been presented herein, but it is understood and contemplated that the invention can be practiced in various other forms. For example, an SFDM, discussed herein in terms of a module separate from a machine controller, can be integrated as part of the controller. Similarly, functionality associated with specific modules herein can be combined or reconfigured. Various means and methods for isolating and monitoring one or more ac components are contemplated, as are other means and methods for determining a difference between the actual and ideal commands.

The invention claimed is:

1. A system, comprising:
an electric machine (EM);
an energy conversion module (ECM) configured to provide energy to said EM;
a sensor configured to sense a phase current between said ECM and said EM and provide feedback current;
a controller configured to provide a voltage command configured to cause production of a desired torque by said EM, said voltage command dependent on said feedback current provided by said sensor; and
a sensor fault detection module (SFDM) configured to isolate and use an ac component of said voltage command to detect an error at said sensor.

2. The system of claim 1, wherein said ac component comprises a fundamental frequency component of said voltage command.

3. The system of claim 2, wherein said SFDM is configured to determine the negative sequence of said fundamental frequency component.

4. The system of claim 1, wherein said SFDM is configured to determine a deviation between said voltage command provided by said controller and an ideal voltage command, and use said deviation to detect said error.

5. The system of claim 1, wherein said ac component comprises a harmonic component of said actual voltage command.

6. A sensor fault detection module (SFDM), comprising:
an ac component monitoring module (ACMM) having a voltage mapping module (VMM) configured to provide an ideal voltage command configured to effect a desired electric machine (EM) torque output, a deviation determination module (DDM) configured to determine a deviation between said ideal voltage command and an actual voltage command provided for said EM, said actual voltage command dependent on feedback current provided by a sensor configured to sense phase current for said EM, and an ac component magnitude module (MAGM) configured to determine the magnitude of an ac component of said deviation between said ideal and actual voltage commands; and
an error determination module (EDM) configured to use said magnitude to determine whether an error is present at said sensor.

7. The SFDM of claim 6, wherein said DDM is configured to isolate a fundamental frequency component of said actual voltage command.

8. The SFDM of claim 7, wherein said DDM is configured to determine the negative sequence of said fundamental frequency component.

9. The SFDM of claim 6, wherein said DDM is configured to isolate a harmonic component of said actual voltage command.

* * * * *